United States Patent
Kasperkovitz

(10) Patent No.: US 8,838,054 B2
(45) Date of Patent: Sep. 16, 2014

(54) FM RECEIVER

(75) Inventor: Wolfdietrich Georg Kasperkovitz, Waalre (NL)

(73) Assignee: Semiconductor Ideas to the Market, Breda (NL)

( * ) Notice: Subject to any disclaimer, the term of this patent is extended or adjusted under 35 U.S.C. 154(b) by 1080 days.

(21) Appl. No.: 12/527,895

(22) PCT Filed: Feb. 20, 2008

(86) PCT No.: PCT/EP2008/001297
§ 371 (c)(1),
(2), (4) Date: Aug. 25, 2009

(87) PCT Pub. No.: WO2008/101674
PCT Pub. Date: Aug. 28, 2008

(65) Prior Publication Data
US 2010/0093297 A1    Apr. 15, 2010

(30) Foreign Application Priority Data
Feb. 22, 2007 (EP) ................................. 07003673

(51) Int. Cl.
*H04B 1/16* (2006.01)
(52) U.S. Cl.
USPC .................... 455/205; 455/180.1; 455/254
(58) Field of Classification Search
CPC .......... H04B 1/18; H04B 1/1638; H04B 1/28; H04B 1/16
USPC ............................................ 455/205
See application file for complete search history.

(56) References Cited

U.S. PATENT DOCUMENTS

| | | | | |
|---|---|---|---|---|
| 4,563,651 A * | 1/1986 | Ohta et al. | ............. | 329/318 |
| 5,287,558 A * | 2/1994 | Hansen | ............. | 455/296 |
| 5,307,517 A * | 4/1994 | Rich | ............. | 455/306 |
| 5,710,993 A * | 1/1998 | Brekelmans | ............. | 455/188.1 |
| 6,738,606 B1* | 5/2004 | Kianush et al. | ............. | 455/254 |
| 2001/0050925 A1* | 12/2001 | Mesiwala et al. | ............. | 370/503 |
| 2001/0050926 A1* | 12/2001 | Kumar | ............. | 370/529 |

* cited by examiner

*Primary Examiner* — Ajibola Akinyemi
(74) *Attorney, Agent, or Firm* — Robert M. McDermott, Esq.

(57) ABSTRACT

FM receiver including an RF input circuit followed by a tunable mixer stage for frequency conversion of an RF FM signal into an IF FM signal, which is coupled to an FM input of a first narrow-band IF filter. The center frequency of the first narrow-band IF filter is controlled to vary in dependence on the IF FM signal. The first narrow-band IF filter is subsequently coupled to a first FM demodulator and a first LF signal processing unit. To increase the receiver's selectivity and sensitivity without adversely affecting tracking stability, the FM input of a first narrow-band IF filter is coupled through a second FM demodulator to a control input of said first narrow-band FM tracking filter for a feed forward tracking control of the center frequency of said first narrow-band FM tracking filter with the momentary frequency of the IF FM signal.

20 Claims, 3 Drawing Sheets

FM RECEIVER

The invention relates to FM receivers of a type including a first narrow-band FM tracking filter having an FM input being supplied with an FM input signal, an output of said first narrow-band FM tracking filter being coupled to a first FM demodulator. Such FM receivers may be FM radio receivers or TV receivers for receiving TV standard broadcast signals with FM sound carriers. In FM radio broadcast receivers said first narrow-band FM tracking filter is functioning as IF filter and is supplied at its FM input with an IF FM signal from a tunable mixer stage for frequency conversion of an RF FM signal into an IF FM signal. The center frequency of the tracking filter is controlled to vary in dependence on the IF FM signal. In TV receivers for receiving TV standard broadcast signals with FM sound carriers said first narrow-band FM tracking filter is being supplied at its FM input with an FM sound carrier from a videodemodulator. The term "narrow-band" refers to a passband filter width, which is relatively small with respect to the channel bandwidth, i.e. the IF filter bandwidth of FM receivers with fixed center frequency.

FM radio broadcast receivers of this type are disclosed in U.S. Pat. No. 5,241,697.

In conventional FM radio broadcast receivers such as referred to hereabove, the baseband FM modulation signal at an output of the first FM demodulator is being fed back to a control input of the first narrow-band FM tracking filter preceding said first FM demodulator with the aim to track the center frequency tuning of said first narrow-band FM tracking filter with the momentary frequency deviations of the FM IF signal. With the center frequency of the first narrow-band FM tracking filter following closely the frequency modulation of the IF carrier signal, the bandwidth of said first narrow-band FM tracking filter can be narrowed down relative to the IF filter bandwidth of FM receivers with fixed IF filters. This improves the receiver's selectivity and sensitivity with respect to FM receivers with fixed IF filters.

However, due to the ever growing station density, and in particular the requirement to perform also in constantly changing receiving conditions, such as in mobile operation, adjacent channel captures and other adjacent channel interferences are increasing. This necessitates to further decrease the bandwidth of the first narrow-band FM tracking filter. As a consequence, delay in frequency tracking will increase, therewith reducing the adjacent channel suppression and deteriorating in particular higher modulation frequencies of the FM IF signal.

In the course of time, many different combinations of (dynamic) FM IF tracked control of IF filter characteristics, FM demodulator, LF unit and control loop parameters of the conventional FM receiver concept have been considered in an attempt to escape from the fundamental limitations to the trade offs, which in this known concept are to be made between the selectivity and sensitivity on the one hand and performance indicators such as stability, THD (Third Harmonic Distortion), stereo channel separation and LF response on the other hand. For instance, the above conventional FM receiver has circuitry for changing the signal transmission characteristic of the receiver's IF and/or LF units in response to certain receiving or interference states. For that, a detector module is used having detector circuits for detecting values characteristic of said receiving or interference states. Inputs of these detector circuits are being connected with a circuit point of the IF or LF unit carrying the signal to be processed and outputs of these detector circuits provide signals characterizing receiving or interference states to an evaluation circuit included in the circuitry for changing the signal transmission characteristic. The evaluation circuit is to process said signals characterizing the receiving and interference states and is includes an input portion followed by a logic unit. The input portion is provided with at least one amplitude and/or time threshold circuit connected with the detector module. The logic unit provides processed signals characteristic of receiving and interference states as control signals to influence individual stages of the IF or LF unit. Such circuitry for changing the signal transmission characteristic are considerably complex, introduce additional sources of instability and only provide limited improvement in specifically defined receiving or interfering states.

In consequence, amongst other things, it is an object of the invention to break through the fundamental limitations in the trade off between selectivity, sensitivity, stability, signal-to-noise ratio, stereo separation, distortion factor and other performance indicators of conventional FM receivers by providing an extra degree of freedom in the design of in particular the IF unit of FM radios, allowing to obtain fundamental improvements on all performance indicators.

Now, therefore, an FM receiver including a first narrow-band FM tracking filter having an FM input being supplied with an FM input signal, an output of said first narrow-band FM tracking filter being coupled to a first FM demodulator according to the invention is characterized by said FM input being coupled through a second FM demodulator to a control input of said first narrow-band FM tracking filter for a feed forward tracking control of the center frequency of said first narrow-band FM tracking filter with the momentary frequency of the FM input signal.

The invention is based on the insight, that by separating in an FM receiver the signal selection function from the filter tracking control function, the signal selectivity can be chosen freely, without affecting the filter tracking control and vice versa. This introduces an extra degree of freedom and avoids the necessity to make the trade offs required in the conventional FM receiver concept.

According to the invention, signal processing occurs within a signal processing path following the input of the first narrow band FM tracking filter and including this first narrow band FM tracking filter, the first FM demodulator and the LF signal processing unit. The generation of the filter tracking control signal occurs in a feed forward control path having an input in common with the input of said first narrow band FM tracking filter and including said second FM demodulator. The demodulated baseband signal is being fed forward from the output of said second FM demodulator to the control input of said first narrow-band FM tracking filter for a feedforward control of the center frequency thereof. The so obtained separation between signal processing on the one hand and filter tracking control on the other hand allows to optimize the first FM demodulator for correct demodulation of the FM modulation signal and to optimize the second FM demodulator independent from the first FM demodulator for correct filter tracking control. This brings within reach a yet unheard improvement of all receiver performance indicators.

In FM radio broadcast receivers said first narrow-band FM tracking filter is functioning as IF filter and is supplied at its FM input with an IF FM signal and in TV receivers for receiving TV standard broadcast signals with FM sound carriers said first narrow-band FM tracking filter is being supplied at its FM input with an TV FM sound carrier. In the following the term "IF FM signal" is used to indicate the FM input signal at the input of the first narrow-band FM tracking filter in both FM radio and TV broadcast receivers.

A preferred embodiment of the FM receiver according to the invention is characterized by said first and second FM demodulators providing linear FM demodulation, said first FM demodulator being optimized in its range of linear operation and said second FM demodulator being optimized to provide graceful degradation of its output signal at IF FM signal deviations exceeding its range of linear operation. By applying this measure, signal distortion within the signal processing path is being minimized on the one hand, whereas sharp transients in the frequency tracking control of the first narrow-band FM tracking filter at the occurrence of large momentary FM signal deviations are avoided.

An alternative preferred embodiment of the FM receiver according to the invention is characterized by said first FM demodulator providing wideband FM demodulation of the IF FM signal and said second FM demodulator providing narrowband FM demodulation of the IF FM signal. This measure allows to linearize FM demodulation in the signal processing path and to stabilize frequency tracking control of the first narrow-band FM tracking filter also at the occurrence of large momentary FM signal deviations by limiting said frequency tracking.

Further optimization of the frequency tracking control may be obtained by a second narrow-band IF filter being arranged between the tunable mixer stage and the second FM demodulator said first FM demodulator allowing to further optimize the feedforward frequency tracking control of the first narrow-band FM tracking filter.

Said second narrow-band filter may be fixed, or alternatively being implemented by a second narrow-band FM tracking filter with a narrow bandwidth and a variable center frequency, said tunable mixer stage being coupled through a third FM demodulator to a control input of said second narrow-band FM tracking filter for a feed forward tracking control of the center frequency of said second narrow-band FM tracking filter with the momentary frequency of the IF FM signal at the FM input of the first narrow-band FM tracking filter.

The invention will be described below in block diagram form in order not to obscure the present invention in unnecessary detail together with a description of the preferred embodiments of the invention and reference to the drawing figures, wherein like or similar elements are designated by the same reference numeral and wherein.

Figure 1:
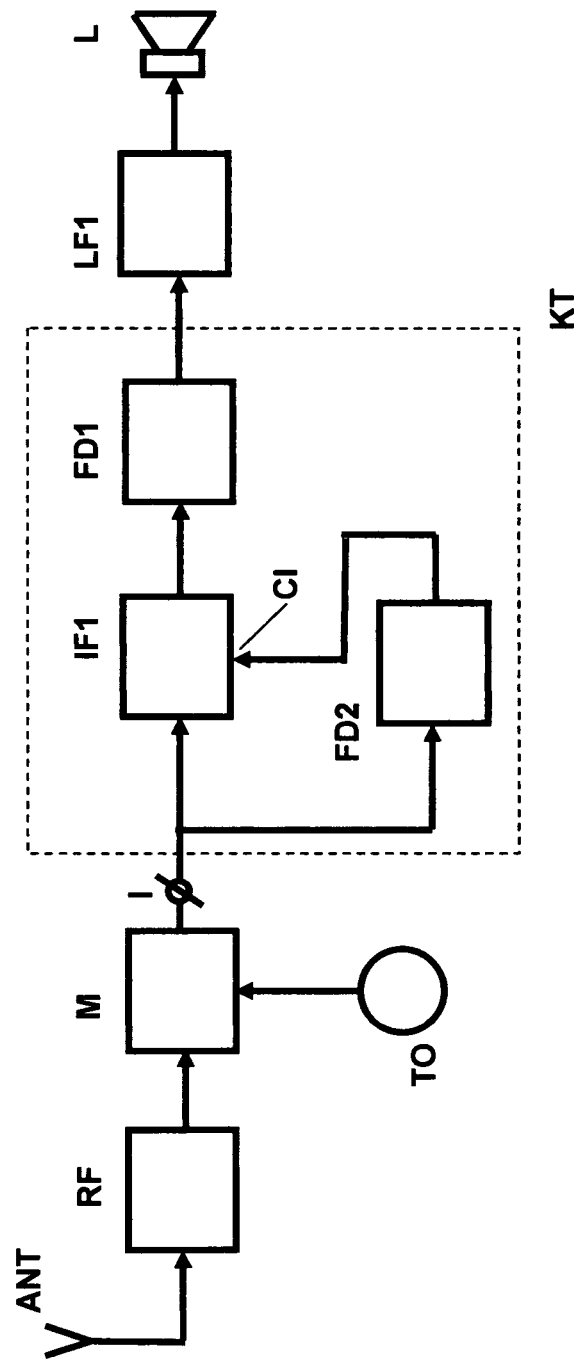
FIG. 1 shows an FM receiver according to the invention in an embodiment of an FM radio broadcast receiver.

The embodiment of the FM receiver according to the invention as shown in FIG. 1 comprises an RF input circuit RF receiving RF FM broadcast signals from antennae means ANT. The RF input circuit is subsequently coupled to a tunable mixer stage M and a signal processing path, including a first narrow-band IF filter IF1 having an FM input I, a first FM demodulator FD1 and a first LF signal processing unit LF1. The tunable mixer stage M is being supplied with a tunable local mixing carrier from a tuned oscillator TO for frequency conversion of a wanted RF FM signal into an IF FM signal. This IF FM signal is IF filtered in said first narrow-band IF filter IF1 and demodulated to baseband in a first FM demodulator FD1. The so obtained baseband modulation signal is further processed in the LF signal processing unit LF1 followed by reproduction of its sound content in sound reproduction device L.

According to the invention the tunable mixer stage M is also coupled through said FM input I to a feedforward control path including a second FM demodulator FD2, which is coupled to a control input CI of the first IF filter IF1, also referred to as first narrow-band FM tracking filter IF1. This second FM demodulator FD2—like the first FM demodulator FD1—also demodulates the FM IF signal into baseband, however now for the purpose of generating a frequency tracking control signal for the first narrow-band FM tracking filter IF1. The baseband modulation signal is being supplied from an output of the second FM demodulator FD2 to the control input CI of said first narrow-band FM tracking filter IF1 causing the center frequency of said first narrow-band FM tracking filter IF1 to track the momentary frequency of the IF FM signal at the FM input I. The circuitry formed by the first narrow-band FM tracking filter IF1, the first FM demodulator FD1 and the feedforward control path including the second FM demodulator FD2 are hereinafter also referred to as KT system.

The use of mutually separated paths for signal processing and tracking control provides an extra degree of freedom, which avoids the necessity to make trade offs between the selectivity or bandwidth of the first narrow-band FM tracking filter IF1 and the stability and/or accuracy of tracking control. This allows for an optimization of the overall receiver performance in which performance indicators such as selectivity and sensitivity, stability, THD (Third Harmonic Distortion), stereo channel separation and LF response are all significantly improved with respect to conventional FM receivers.

Figure 2:
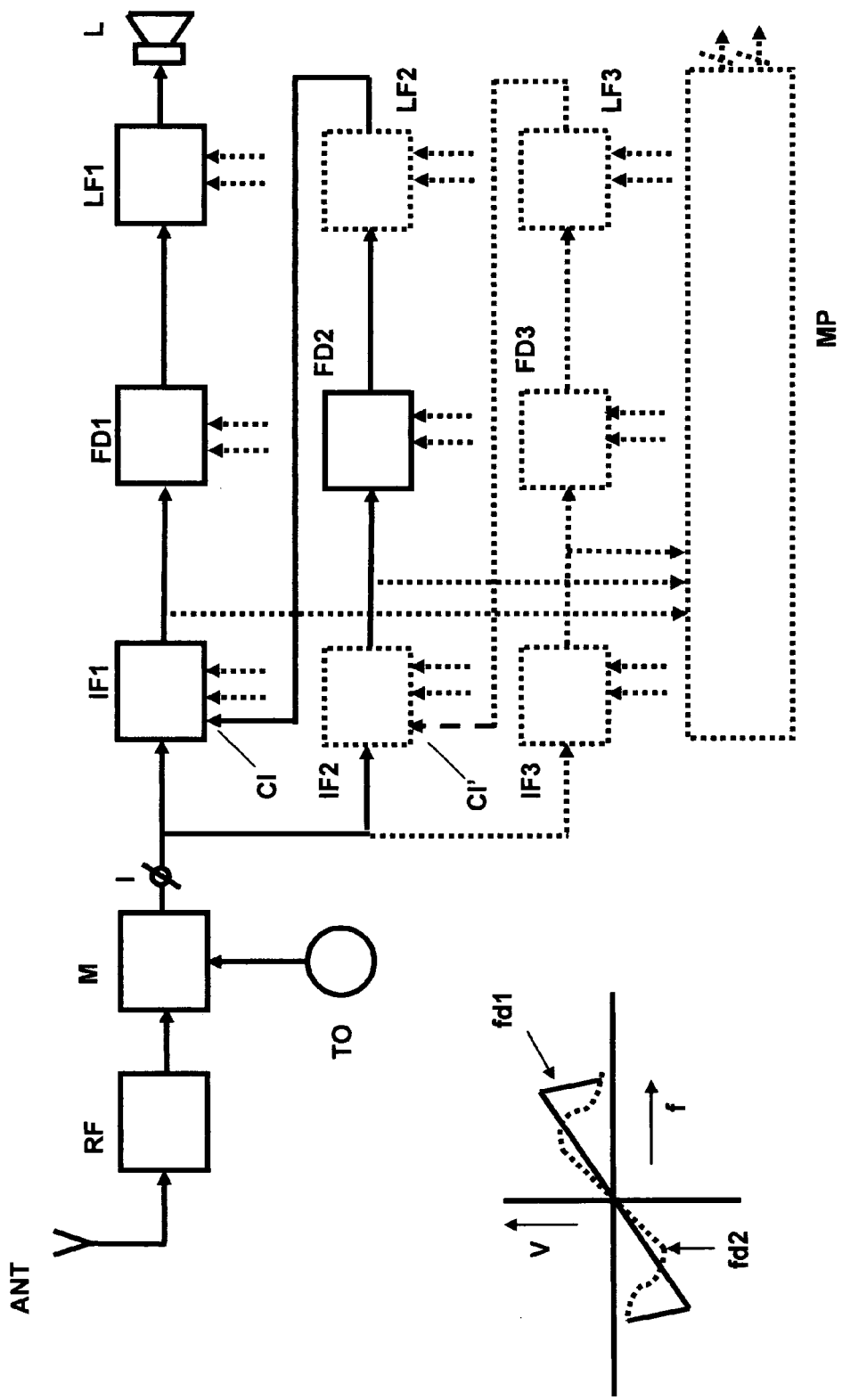
FIG. 2 shows various control options which are applicable to the FM receiver according to the invention.

FIG. 2 shows in solid line representation the FM receiver according to the invention of FIG. 1 and in dotted lines various new options of parameter control, which can be applied to further optimize the receiver's performance. The above feedforward control path of the first IF filter IF1 now includes a second IF filter IF2, also referred to as second narrow-band FM tracking filter IF2, having a narrow bandwidth and a controllable center frequency and being inserted between the FM input I and the second FM demodulator FD2 as well as a second LF signal processing unit LF2 inserted between the second FM demodulator FD2 and the control input CI of the first narrow-band FM tracking filter IF1. The tunable mixer stage M is additionally coupled through the FM input I to a further feedforward control path including subsequently coupled to the FM input I: a third IF filter IF3 with fixed center frequency, a third FM demodulator FD3 and a third LF signal processing unit LF3, which is coupled to a control input CI' of the second narrow-band FM tracking filter IF2.

In said further feedforward control path a frequency tracking control signal for the second narrow-band FM tracking filter IF2 is generated. The FM receiver of this FIG. 2 also includes a control signal generating micro processor MP, which derives a set of control signals for each of the circuits IF1-IF3, FD1-FD3 and LF1-LF3, from the output signals of the first to third FM demodulators FD1-FD3, to control e.g. the filter characteristic and/or bandwidth of first to third IF filters IF1-IF3, the demodulation linearity and graceful degradation of first to third FM demodulators FD1-FD3 and the signal dependent response (stereo channel separation, soft mute, high cut frequency control) of the first to third LF signal processing units LF1-LF3. These control signals offer a wide range of performance optimization options, to be controlled by the micro processor MP. The programming of said micro processor MP to obtain a desired performance lies within the ability of the skilled person.

Another optimization in overall receiver performance is obtained by choosing implementations of said first and second FM demodulators FD1 and FD2, respectively, providing linear FM demodulation, which implementation of said first FM demodulator FD1 is optimized in its range of linear operation and which implementation of said second FM demodulator FD2 is optimized to provide graceful degradation of its output signal at IF FM signal deviations exceeding its range of linear operation. This allows for a linear signal processing also at high modulation frequencies combined with a continuous frequency tracking control of the first narrow-band FM tracking filter IF1 also at the occurrence of large momentary FM signal deviations.

Figure 3:
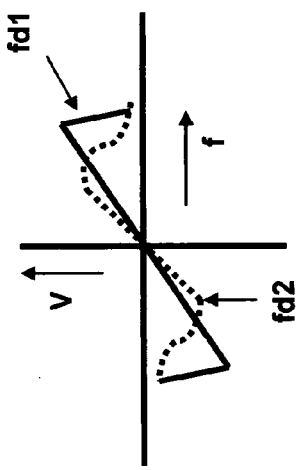
FIG. 3 shows FM demodulator curves applicable in an FM receiver according to the invention.

FIG. 3 shows in curve fd1 the demodulation characteristic of an FM demodulator implementation which can be used as said first FM demodulator FD1 and in curve fd2 the demodulation characteristic of an FM demodulator implementation which can be used as said second FM demodulator FD2. Such implementations are on themselves e.g. from "High-Performance Frequency-Demodulation Systems" by M. H. L Kouwenhoven, published by Coronet Books Inc., September 1998, ISBN-10: 9040716412; ISBN-13: 978-9040716416 need no further amplification for a proper understanding of the invention.

In an alternative embodiment of the FM receiver according to the invention said first FM demodulator FD1 provides wideband FM demodulation of the IF FM signal and said second FM demodulator FD2 narrowband FM demodulation. This measure allows to linearize FM demodulation in the signal processing path and to stabilize frequency tracking control of the first narrow-band FM tracking filter IF1 by limiting said frequency tracking at the occurrence of large momentary FM signal deviations.

Figure 4:
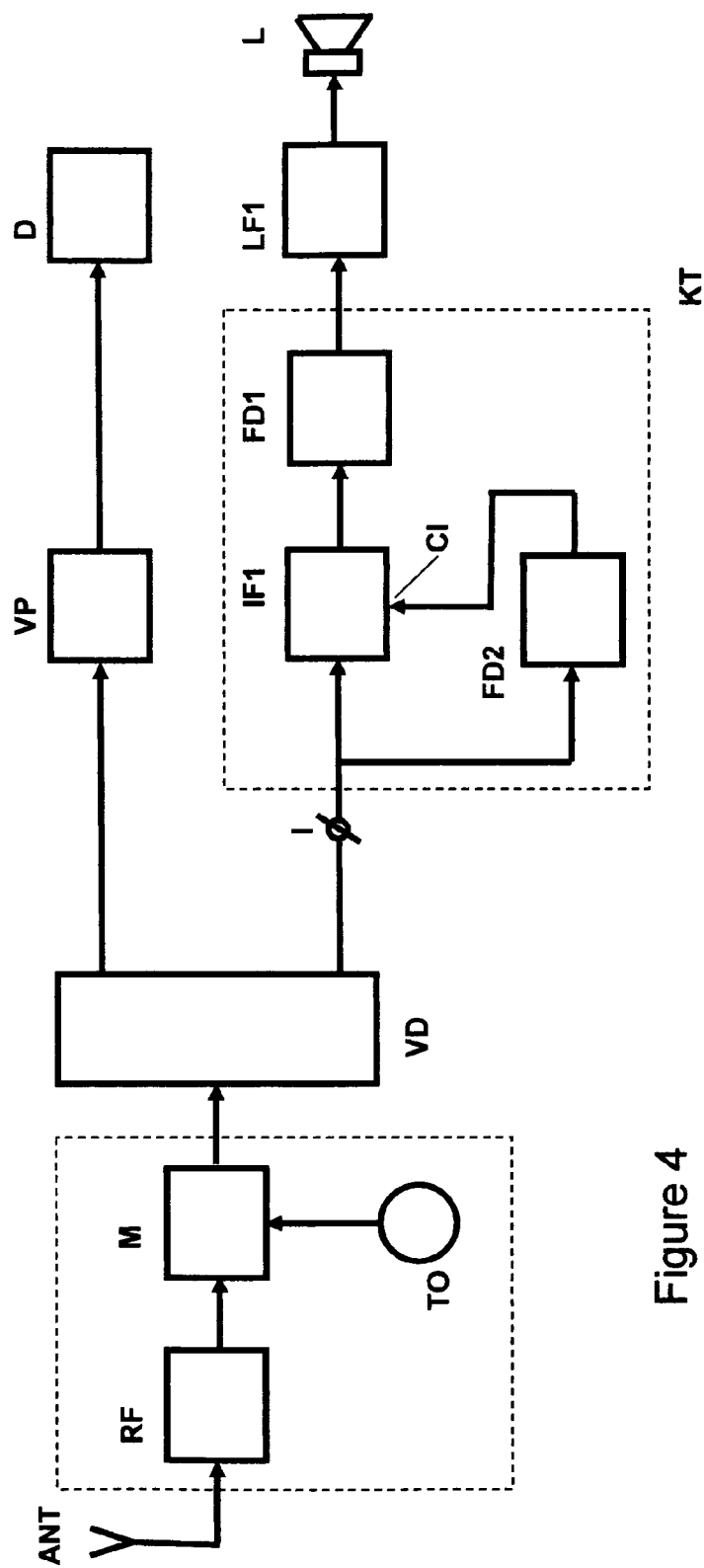
FIG. 4 shows an FM receiver according to the invention in an embodiment of a TV broadcast receiver.

FIG. 4 shows an FM receiver according to the invention in an embodiment of a TV broadcast receiver comprising an RF input circuit RF receiving a wanted RF TV standard broadcast signal with an FM sound carrier from antennae means ANT. The RF input circuit is subsequently coupled to a tunable mixer stage M and a video signal demodulator VD. The tunable mixer stage M is being supplied with a tunable local mixing carrier from a tuned oscillator TO for frequency conversion of the wanted RF TV standard broadcast signal into an IF TV signal, which is filtered and demodulated into a baseband video signal in video filter and detection means VD. The so obtained baseband video signal includes a baseband picture signal and said FM sound carrier. The baseband picture signal is supplied from a picture signal output of the video filter and detection means VD through a video signal processor VP to a display D. The FM sound carrier is supplied from an FM sound carrier output of the video filter and detection means VD to the FM input of the first narrow-band FM tracking filter IF1 of the KT system for further processing of the FM signal in accordance with that of FIG. 1.

While the invention has been particularly shown and described with reference to preferred embodiments thereof, it will be understood by those skilled in the art that various changes in form and details may be made without departing from the spirit and scope of the invention. In particular, the control options as illustrated in FIG. 2 may well be changed by choosing other control parameters for the circuits in the signal processing and feedforward tracking control paths. Said second IF filter IF2 may well be fixed, i.e. non-tracking, which allows to refrain from using said further feedforward control path. The first FM demodulator FD1 may well be identical to the second FM demodulator FD2 and these FM demodulators may be implemented to provide demodulation characteristics, which differ from those shown in FIG. 3.

The invention is embodied in each new characteristic and each combination of characteristics. Any reference signs do not limit the scope of the claims. Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal, electromagnetic wave signal, or data signal. The meaning of "a", "an", and "the" include plural references. The meaning of "in" includes "in" and "on".

The invention claimed is:

1. An FM receiver comprising:
   a first FM demodulator, and
   a first narrow-passband FM tracking filter that includes an FM input that is supplied with an FM input signal, and an output that is coupled to the first FM demodulator,
   wherein the FM input is coupled through a second FM demodulator to a control input of the first narrow-passband FM tracking filter to provide a feed forward tracking control of a center frequency of the first narrow-passband FM tracking filter based on a momentary frequency of the FM input signal.

2. The FM receiver of claim 1, wherein the first and second FM demodulators provide linear FM demodulation, the first FM demodulator being optimized in its range of linear operation and the second FM demodulator being optimized to provide graceful degradation of its output signal at signal deviations of the FM input signal exceeding its range of linear operation.

3. The FM receiver of claim 2, including:
   a second FM tracking filter that includes a narrow-passband and a variable center frequency and is arranged between the FM input and the second FM demodulator, and
   a third FM demodulator, the FM input being coupled through the third FM demodulator to a control input of the second narrow-passband FM tracking filter for a feed forward tracking control of a center frequency of the second FM tracking filter based on a momentary frequency of the FM input signal.

4. The FM receiver of claim 2, wherein the first narrow-passband FM tracking filter includes a bandwidth in an order of magnitude of a bandwidth of the FM input signal.

5. The FM receiver of claim 2, including:
   an RF input circuit, and
   a tunable mixer stage coupled to the RF input circuit and configured to provide frequency conversion of an RF FM signal into an IF FM signal,
   wherein the first narrow-passband FM tracking filter receives the IF FM signal as the FM input signal.

6. The FM receiver of claim 2, wherein the FM input corresponds to an IF FM TV sound carrier.

7. The FM receiver of claim 1, wherein the first FM demodulator provides wideband FM demodulation of the FM input signal and the second FM demodulator provides narrowband FM demodulation of the FM input signal.

8. The FM receiver of claim 7, including:
   a second FM tracking filter that includes a narrow-passband and a variable center frequency and is arranged between the FM input and the second FM demodulator, and
   a third FM demodulator, the FM input being coupled through the third FM demodulator to a control input of the second narrow-passband FM tracking filter for a feed forward tracking control of a center frequency of the second FM tracking filter based on a momentary frequency of the FM input signal.

9. The FM receiver of claim 7, wherein the first narrow-passband FM tracking filter includes a bandwidth in an order of magnitude of a bandwidth of the FM input signal.

10. The FM receiver of claim 7, including:
an RF input circuit, and
a tunable mixer stage coupled to the RF input circuit and configured to provide frequency conversion of an RF FM signal into an IF FM signal,
wherein the first narrow-passband FM tracking filter receives the IF FM signal as the FM input signal.

11. The FM receiver of claim 7, wherein the FM input corresponds to an IF FM TV sound carrier.

12. The FM receiver of claim 1, including:
a second FM tracking filter that includes a narrow-passband and a variable center frequency and is arranged between the FM input and the second FM demodulator, and
a third FM demodulator, the FM input being coupled through the third FM demodulator to a control input of the second narrow-passband FM tracking filter for a feed forward tracking control of a center frequency of the second FM tracking filter based on a momentary frequency of the FM input signal.

13. The FM receiver of claim 12, wherein the first narrow-passband FM tracking filter includes a bandwidth in an order of magnitude of a bandwidth of the FM input signal.

14. The FM receiver of claim 12, including:
an RF input circuit, and
a tunable mixer stage coupled to the RF input circuit and configured to provide frequency conversion of an RF FM signal into an IF FM signal,
wherein the first narrow-passband FM tracking filter receives the IF FM signal as the FM input signal.

15. The FM receiver of claim 12, wherein the FM input corresponds to an IF FM TV sound carrier.

16. The FM receiver of claim 1, wherein the first narrow-passband FM tracking filter includes a bandwidth in an order of magnitude of a bandwidth of the FM input signal.

17. The FM receiver of claim 16, including:
an RF input circuit, and
a tunable mixer stage coupled to the RF input circuit and configured to provide frequency conversion of an RF FM signal into an IF FM signal,
wherein the first narrow-passband FM tracking filter receives the IF FM signal as the FM input signal.

18. The FM receiver of claim 16, wherein the FM input corresponds to an IF FM TV sound carrier.

19. The FM receiver of claim 1, including:
an RF input circuit, and
a tunable mixer stage coupled to the RF input circuit and configured to provide frequency conversion of an RF FM signal into an IF FM signal,
wherein the first narrow-passband FM tracking filter receives the IF FM signal as the FM input signal.

20. The FM receiver of claim 1, wherein the FM input corresponds to an IF FM TV sound carrier.

* * * * *